United States Patent [19]

Kline

[11] Patent Number: 5,051,981
[45] Date of Patent: Sep. 24, 1991

[54] DIGITAL FILTERING

[75] Inventor: Richard B. Kline, East Walpole, Mass.

[73] Assignee: Codex Corporation, Mansfield, Mass.

[21] Appl. No.: 471,700

[22] Filed: Jan. 29, 1990

Related U.S. Application Data

[63] Continuation of Ser. No. 146,328, Jan. 21, 1988, abandoned.

[51] Int. Cl.[5] .............................................. H04J 3/00
[52] U.S. Cl. .................................. 370/32.1; 379/406;
379/410; 375/60; 375/8; 341/144; 364/724.1
[58] Field of Search .................. 370/32, 32.1; 379/398,
379/400, 406, 410, 411; 375/8, 14, 60, 106;
341/144; 364/724.1

[56] References Cited

U.S. PATENT DOCUMENTS

| | | | |
|---|---|---|---|
| 3,958,191 | 5/1976 | Jones, Jr. .................. | 332/1 |
| 3,987,374 | 10/1976 | Jones, Jr. .................. | 332/9 R |
| 4,074,086 | 2/1978 | Falconer et al. .......... | 379/410 |
| 4,453,259 | 6/1984 | Miller ....................... | 375/106 |
| 4,578,796 | 3/1986 | Charalambous et al. | 375/8 |
| 4,682,358 | 7/1987 | Werner ..................... | 379/411 |
| 4,746,899 | 5/1988 | Swanson et al. ......... | 340/347 AD |
| 4,757,519 | 7/1988 | Collison et al. .......... | 375/60 |

OTHER PUBLICATIONS

Huber, A. et al., "FIR Lowpass Filter for Signal Decimation with 15 MHZ Clock Frequency", IEEE, ICASSP, Apr., 1986, pp. 1533-1536.
Candy, J. et al., "Using Triangulary Weighted Interpolation to Get 13-Bit PCM from Sigma-Delta Modulator", IEEE, Nov. 1976 pp. 1268-1275.
Candy, J., "Decimation for Sigma Delta Modulation", IEEE Transactions on Communications, vol. Com-34, No. 1, Jan. 1986, pp. 72-76.

(List continued on next page.)

Primary Examiner—Jin F. Ng
Assistant Examiner—Jhancy Augustus
Attorney, Agent, or Firm—Fish & Richardson

[57] ABSTRACT

A digital decimation filter for receiving a stream of input digital samples at an input sample rate, and for delivering a corresponding stream of output digital samples at a different output sample rate stores a plurality of input digital samples, derives samples of the output stream from the stored input digital samples, and makes an output sample available for inclusion in the output stream at all times, whereby the output sample may be delivered with a selectable phase. In other aspects, an analog-to-digital converter has a sigma-delta modulator for generating a high rate stream of digital samples of an analog signal at a rate substantially higher than the Nyquist rate, and a digital decimation filter for receiving the high rate stream and delivering a corresponding stream of filtered output digital samples at a lower rate, the decimation ratio being selectable; and a multiple-mode modem for use with a channel on which a carrier may be modulated in accordance with at least two different possible modulation schemes (the channel being of the kind that induces echo signals, the modulation schemes comprising techniques for avoiding the effects of the echo signals), receives the modulated carrier from the channel and converts it to a corresponding stream of digital samples, using receive circuitry that has an analog-to-digital converter feeding a programmable digital filter for selectively providing filtering functions applicable respectively to the two different modulation schemes, whereby different receive filters applicable to different modulation schemes need not be provided ahead of the analog-to-digital converter.

16 Claims, 4 Drawing Sheets

OTHER PUBLICATIONS

Candy, J., "A Use of Double Integration in Signal Delta Modulation", IEEE Transaction on Communications, vol. Com-33, No. 3, Mar. 1985, pp. 249-258.

Thomson Semiconductors, "Block Diagram of the Kit of Three Circuits", shows a filter in a modem analog front-end chip.

Yakawa, A. et al., "An Oversampling A-to-D Structure For VSLI Digital Codec's", IEEE, 1985, pp. 1400-1403.

Meleis, H. et al., "A Novel Architecture Design For VLSI Implementation of an FIR Decimation Filter", IEEE, 1985, pp. 1380-1383.

Hauser, M. et al., "MOS ADC-Filter Combination That Does Not Require Precision Analog Components", IEEE International Solid State Short Circuits Conference, Feb. 13, 1985, pp. 80-81, 313.

Crystal Semiconductor Corporation, CS 5316, "Delta-Sigma CMOS Analog to Digital Converter, Aug. 1986.

Adams, R., "Design and Implementation of an Audio 18-Bit Analog-to-Digital Using Oversampling Techniques", J. Audio Eng. Soc., vol. 34, No. 3, Mar. 1986, pp. 153-166.

Fairchild F3296AFE, specification sheet for a modem chip showing "programmable bandpass filter".

DIGITAL FILTERING

This is a continuation of co-pending application Ser. No. 146,328, filed on Jan. 21, 1988, now abandoned.

BACKGROUND OF THE INVENTION

This invention relates to digital filters.

It is known to provide a decimating digital low-pass filter at the output of an analog-to-digital (A to D) converter to enable the A-to-D converter to achieve increased amplitude resolution by oversampling the analog signal (i.e., at a multiple of the Nyquist rate). In a decimating digital filter, the output sample rate is lower (e.q., 100 times lower) than the input sample rate.

Candy, "Decimation for Sigma Delta Modulation," IEEE Trans. on Comm., Jan., 1986, shows that for A-to-D converters using second order sigma delta modulation, a near optimal frequency response for the decimation filter is $$H(f) = \sin^3(\pi N f/f_s)/\sin^3(\pi f/f_s)$$

where N is the decimation ratio (between the input sampling rate —$f_s$— and the output sampling rate).

Huber et al., FIR Lowpass Filter for Signal Decimation . . . , ICASSP, 1986, Tokyo, describe a decimation filter that does not require any explicit multiplication and achieves the desired response for use with a sigma delta modulator by an FIR filter followed by cascaded accumulators. Decimation is performed by a separate unit that follows the filter.

A-to-D converters are used, for example, in modems to convert the analog line signal to digital. In typical echo cancellation modems, echo cancellation and resampling are both performed in the analog domain and are followed by a relatively low-resolution analog-to-digital converter. Modems that must serve other communication schemes, e.q., frequency division multiplexing, require alternative receive filters; a multi-mode modem may be provided with multiple analog receive filters that can be program selected.

SUMMARY OF THE INVENTION

One general feature of the invention provides a digital decimation filter for receiving a stream of input digital samples at an input sample rate, and for delivering a corresponding stream of output digital samples at a different output sample rate; in the filter, input digital samples are stored; samples of the output stream are derived from the stored input digital samples; and an output sample is made available for inclusion in the output stream at all times, whereby the output sample may be pointed with a selectable phase.

Preferred embodiments of the invention include the following features. The filtering is done by a non-decimating filter stage followed by a decimating integrate and dump stage. An output sample is made available at all times by providing a pair of integrate and dump circuits operated so that as one circuit is integrating, the sample most recently generated by the other integrate and dump circuit is available for inclusion in the output stream.

Another general feature of the invention provides an analog-to digital converter having a sigma-delta modulator for generating a high rate stream of digital samples of an analog signal at a rate substantially higher than the Nyquist rate, and a digital decimation filter for receiving the high rate stream and delivering a corresponding stream of filtered output digital samples at a lower rate, and in which the decimation ratio is selectable.

Preferred embodiments of the invention include the following features. The digital decimation filter includes an FIR filter having successive storage elements for storing the high rate digital samples, and a mapping element for converting a set of signals tapped from fewer than all of the storage elements into a stream of values, the mapping element being configured to achieve a desired impulse response. The mapping element performs no explicit multiplication. The particular storage elements from which the set of signals are tapped are selected based on the desired decimation ratio, using a multiplexer having inputs connected to a plurality of the storage elements.

Another general feature of the invention provides a multiple-mode modem for use with a channel on which a carrier may be modulated in accordance with at least two different possible modulation schemes, the channel being of the kind that induces echo signals, the modulation schemes comprising techniques for avoiding the effects of the echo signals; the modulated carrier is received from the channel and converted to a corresponding stream of digital samples by receive circuitry that has an analog to-digital converter feeding a programmable digital filter for selectively providing filtering functions applicable respectively to the two different echo avoiding modulation schemes, whereby different receive filters applicable to different modulation schemes need not be provided ahead of the analog-to-digital converter. In preferred embodiments, the modulation scheme includes echo cancellation, or frequency division multiplexing.

The digital filter of the invention is simple, requires only a small amount of storage, has a selectable decimation ratio and a selectable output phase, does not require explicit tap coefficients to be stored or computed, and does not require explicit multiplication. An A-to-D converter based on the filter can have a high resolution and a variable decimation ratio, while remaining relatively low in cost. Multiple modes may be served by a single programmable digital filter.

Other advantages and features will become apparent from the following description of the preferred embodiment, and the claims.

DESCRIPTION OF THE PREFERRED EMBODIMENT

Drawings

We first briefly describe the drawings.

STRUCTURE AND OPERATION

Figure 1:
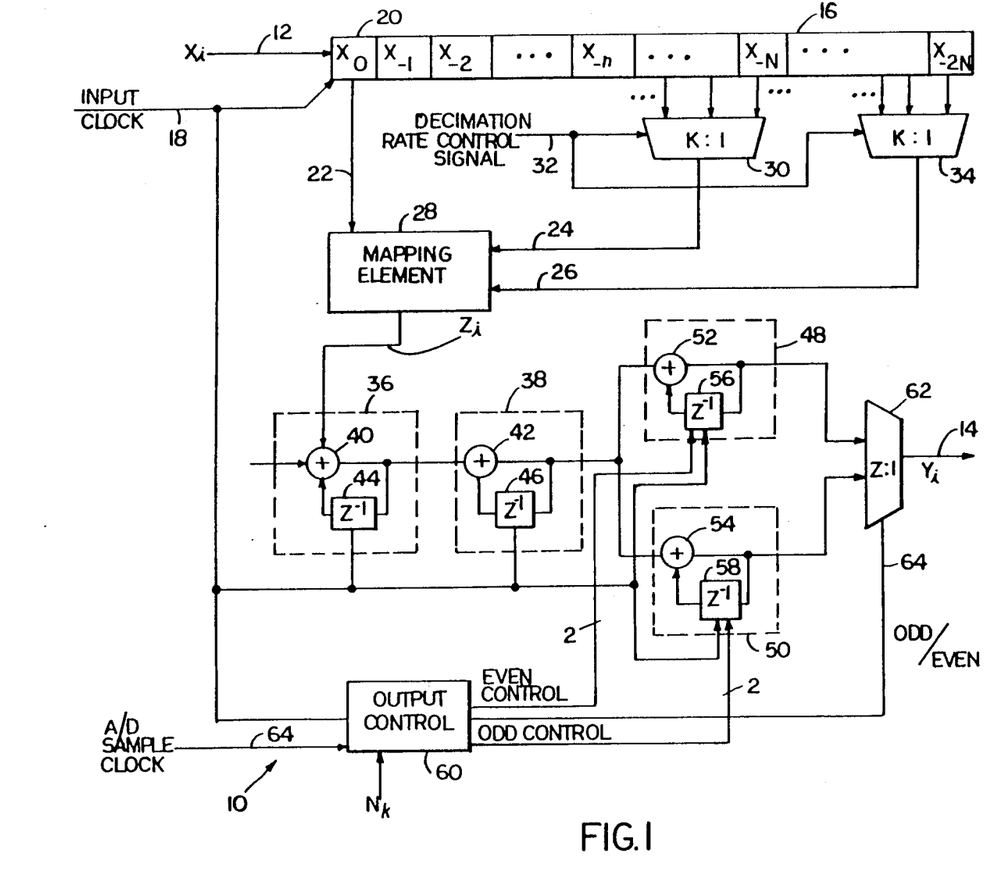
FIG. 1 is a block diagram of a digital decimation filter.

Referring to FIG. 1, a digital decimation filter 10 receives a stream of one-bit digital input samples $x_i$, $i=0,1,\ldots,$ at an input sample rate $f_s$ on an input line 12, and delivers a corresponding stream of digital output samples $y_i$, $i=0,1,\ldots,$ on output line 14 at a selected one of K different output rates $f_k$, lower than $f_s$, and with a selectable output phase.

The samples $x_i$ on input line 12 are shifted into a serial shift register 16 by input clock pulses on line 18. Shift register 16 has $2N+1$ elements 20, where N is the maximum desired decimation ratio (i.e., $f_s/f_{min}$, where $f_{min}$ is the smallest desired output rate); $x_0$ is the element holding the most recently loaded sample, $X_{-2N}$ holds the oldest sample.

For each clock pulse on line 18, three of the samples in the shift register are applied to the three address input lines 22, 24, 26 of a mapping element 28 a looking-up table). The sample applied to address line 22 is always tapped from the $x_0$ element of shift register 16. The sample applied to address line 24 is tapped from 1 of K different elements of the shift register (where the K different elements include element $x_{-N}$ and adjacent elements), via a K:1 multiplexer 30 under control of a decimation rate control signal on line 32. That control signal also governs a second K:1 multiplexer 34 to select one of K different samples (tapped from element $X_{-2N}$ and adjacent elements) to be applied to line 26.

Mapping element 28 maps each possible combination of the three address bits into a corresponding output value to implement an impulse response function to be described below. The successive output values of element 28 are delivered at the same rate as input clock 18 to two cascaded integrators 36, each including a summer 40, 42 and a feedback delay element 44, 46 (one clock pulse delay) also clocked by input clock pulses at rate $f_s$ from line 18. The output of integrator 38 is fed simultaneously to a parallel pair of integrate and dump circuits 48, 50. Each integrate and dump circuit includes a summer 52, 54 and a feedback delay element 56, 58. The delay elements are clocked by input clock pulses at rate $f_s$ (from line 18) and are zeroed respectively by even clear and odd clear pulses delivered (as even control and odd control signals) by output control circuit 60 based on input A/D sample clock pulses on line 63. The even clear and odd clear pulses alternate and both appear at the same rate $f_s/2N_k$, where $N_k$ is the presently selected decimation ratio. The even control and odd control signals from output control circuit 60 also include even hold and odd hold signals which are asserted during even and odd output sample periods.

The outputs of the two integrate and dump circuits are delivered alternately via a 2:1 multiplexer 62 (controlled by an odd/even signal on line 64 appearing at rate $f_s/2N_k$ from clock divider 60) to an output line 14. Because there are two alternating integrate and dump circuits and a multiplexer, a sample is always available and may be used at any time in order to track, e.g., a possibly jittering A/D sample clock 63.

Element 28 is designed in such a way that the overall frequency response of filter 10 is nearly optimum for use following a second order sigma delta modulator (not shown in FIG. 1), i.e., $$H(f) = \sin^3(\pi N_k f/f_s)/\sin^3(\pi f/f_s)$$

Filter 10 implements a corresponding impulse response based on the following principles.

First, the two-stage, non-decimation filter comprising the shift register 16, element 28, and two integrators 36, 38, together provide the frequency response required for a first order sigma delta modulator:

$$H(f) = \sin^2(\pi N_k f/f_s)/\sin^2(\pi f/f_s).$$

The impulse response of this non-decimating portion is $$h(i) = s(i)*s(i).$$

where * is the convolution operator, and $$s(i) = 1, \text{ for } n = 0, 1, 2, \ldots, N_k - 1,$$
$$= 0, \text{ otherwise,}$$

and where the frequency response of the filter whose impulse response is s(i) is $$S(f) = \sin(\pi N_k f/f_s)/\sin(\pi f/f_s).$$

Then $$h(i) = f(i)I(i)I(i),$$
(where
$f(i) = d(i)*s(i)*d(i)*s(i),$
$d(i) = x(i) - x(i-1),$
and
$$d(i)*I(i) = 1, \text{ for } i = 1$$
$$= 0, \text{ otherwise,}$$

Thus, h(i) may be implemented by a filter with response f(i) followed by a cascade of two integrator stages. By computation from the above equations, it can be shown that $$f(i) = 1, \text{ for } i = 0$$
$$-2, \text{ for } i = N_k$$
$$1, \text{ for } i = 2N_k$$
$$0, \text{ otherwise}$$

The impulse response represented by f(i) is implemented by arranging for element 28 to deliver in the ith sampling interval an output ($z_i$) determined by the equation $$z_i = x_i - 2x_{i-N} + X_{i-2N}.$$

Following the two-stage non-decimation filter is a decimating integrate and dump filter whose frequency response is $$H(f) = \sin(\pi * N_k * f/f_s)/\sin(\pi * f/f_s)$$

Implementation of an integrate and dump filter is achieved by clearing an accumulator, and accumulating $N_k$ input data samples to compute one output sample.

To change the decimation ratio merely requires changing the tap locations using the multiplexers 30, 34, in accordance with the above equations, and changing the divisor in output control circuit 60. For example, for a decimation ratio of 65, use taps 0, 65, and 130. In general, for a decimation ratio of $N_k$, use taps, 0, $N_k$, and $2N_k$.

Figure 2:
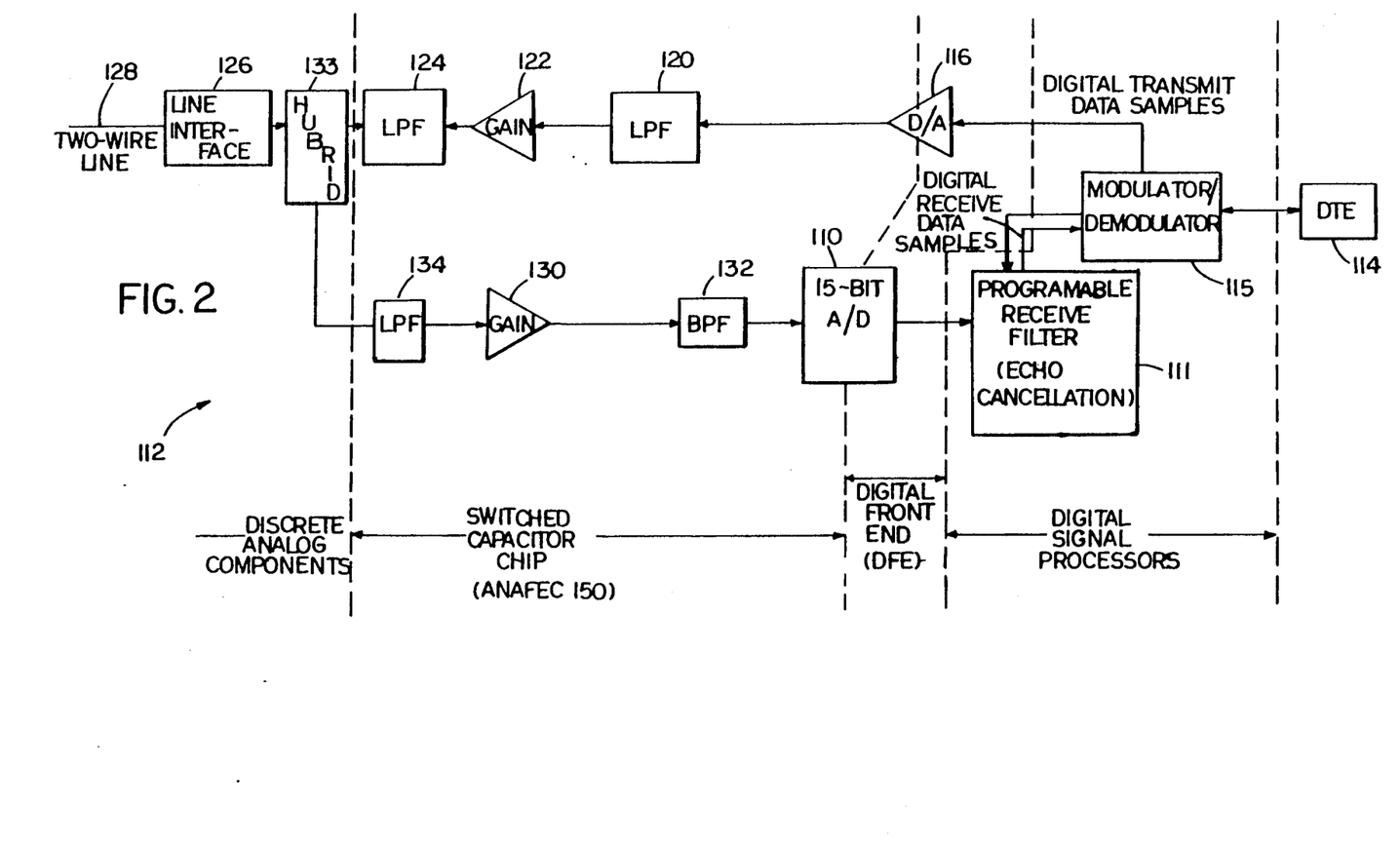
FIG. 2 is a block diagram of a modem.

Referring to FIG. 2, in one application, digital filter 10 (FIG. 1) is part of a high-resolution (15 bit) A/D converter 110 in a full duplex, echo cancelling modem 112 operating in accordance with CCITT standard V.32. In modem 112, digital data to be transmitted from a data terminal-equipment (DTE) 114 passes via a modulator/demodulator 115, a 14-bit sigma-delta modulation D/A converter 116, an analog low pass filter (LPF) 120, a transmit main unit 122, a continuous analog low pass filter 124, a hybrid 133, and a line interface 126 to a two wire telephone line 128. The incoming analog receive signal on line 128 also passes through interface 126, is separated by hybrid 133 and sent via a continuous analog low-pass filter 134, a receiver gain unit 130, an analog broad band band-pass filter (BPF) 132, the 15-bit A/D 110, programmable receive filter (echo cancellation) 111, and modulator/demodulator 115, to DTE 114. Filters 124, 120, 132, 134 are configured for band-shaping appropriate to the telephone line 128, but are suitable for any mode of communication (e.g., echo cancellation, or frequency division multiplexing) on line 128. Filtering specific to the communication mode (in this case echo cancellation) is achieved in receive filter 111.

Figure 3:
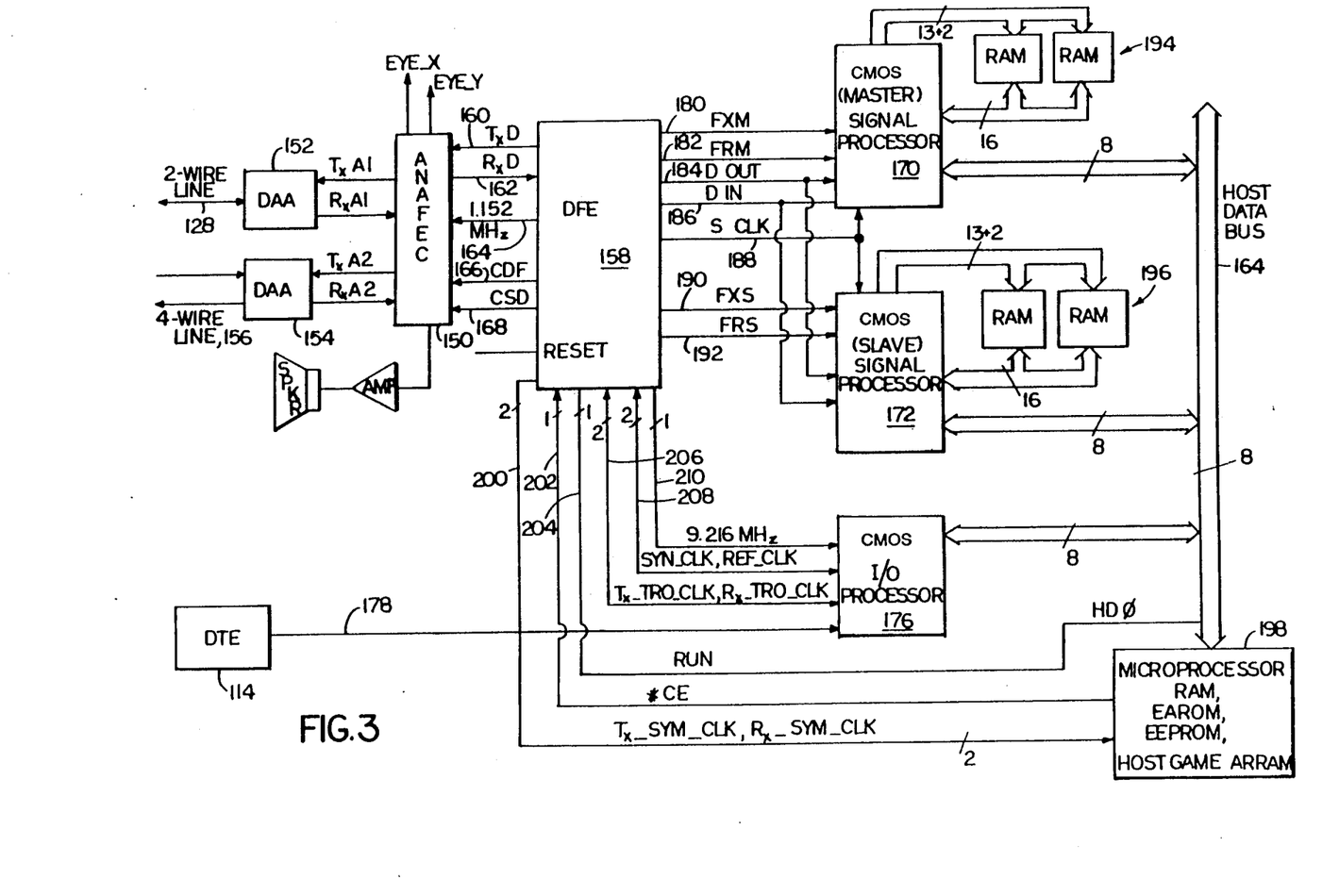
FIG. 3 is a block diagram of one implementation of portions of the modem of FIG. 2.

Referring to FIG. 3, in one implementation of the modem of FIG. 2, the analog domain functions of the low-pass filter portion of D/A 116, LPF 120, transmit gain 122, LPF 124, LPF 134, receive gain 130, BPF 132, and the analog sigma-delta modulation function of 15-bit A/D 110 (FIG. 2) are all performed by a programmable analog front end chip (ANAFEC) 150 using switch capacitor technology. (Note in FIG. 2 that line interface 126 and hybrid 133 are discrete analog components). ANAFEC 150 sends analog transmit data and accepts analog receive data, via data access arrangements (DAA) 152, 154, which respectively serve two wire line 128 and four-wire line 156. ANAFEC 150 also communicates with a CMOS digital front end chip (DFE) 158 via serial lines 160, 162, 164, 166, 168 which respectively carry sigma delta modulated transmit data ($T_xD$) to ANAFEC 150; sigma delta modulated receive data ($R_xD$) to DFE 158; a 1.152 MHz sample clock to ANAFEC 150; control bytes (CSD) to ANAFEC 150 (each in the form of an 8-bit data byte and a 3-bit address pointing to one of six registers in ANAFEC); and a control data frame (CDF) that frames the eleven bit control word. ANAFEC 150 also implements eye pattern generation, speaker gain control, and loop backs for modem check functions.

DFE 158 is a programmable chip that performs (a) the decimating digital low-pass filter function of 15 bit receive A/D 110 (FIG. 2), in accordance with the scheme of FIG. 1; (b) the digital sigma delta modulator functions of transmit D/A 116 (FIG. 2); as well as (c) transmit and receive programmable timing tracker phase lock loop functions, and parallel-to-serial interfacing for communication on lines 160-168. DFE 158 also provides communication between two CMOS signal processors 170, 172 (discussed below), DFE 158, and ANAFEC 150, via the serial interface represented by lines 180 192. DFE 158 also includes a FIFO buffer that buffers digital transmit data, and a digital interpolator to accomplish resampling for purposes of reducing out of band noise on the telephone line. The resampled samples are then delivered to the digital sigma delta modulator.

The functions of modulator/demodulator 115 (FIG. 2) are performed by a pair of CMOS signal processors 170, 172, which share the task in a manner described in Qureshi, U.S. patent application Ser. No. 586,681, filed Mar. 6, 1984. Processor 170 serves as a master, processor 172 as a slave. Processors 170, 172 communicate with each other via DFE serial interface 180 through 192.

The host microprocessor 198 communicates with processors 170, 172, and CMOS input/output (I/0) processor 176 via host data bus 164.

Data passes both ways between I/O processor 176 and DTE 114 on a 15 line interface 178.

DFE 158 sends data to master and slave processors 170, 172 via serial line 184 (DOUT). Master and slave processors send data to the DFE via serial data line 186 (DIN). The DFE generates frame sync signals 180, 182, 190, and 192 to control data flow over serial lines 184 and 186 and SCLK 188 which is a constant 2.308 MHz clock used to clock data and control signals 180, 182, 184, 186, 190, and 192.

Serial line DIN 186 carries 14 bit transmit DAC data, pass through data for the other signal processor unit, DFE control data (sample rate, sample phase, etc.), ANAFEC control data (loop backs, receive gain, transmit gain, etc.), and eye pattern data.

Serial line DOUT 184 carries 15 bit receive A/D data, pass through data from the other signal processor unit, and DFE status information (sampling phase, frequency offset, error conditions, test).

Master and slave signal processors 170, 172, are respectively served by RAMS 194, and 196, which may be down loaded from host processor via host data bus 164.

Host processor circuitry 198 includes a programmed microprocessor (Motorola 68HC09), RAM, EPROM, EEPROM, and a gate array and is connected to host data bus 164. I/O processor 176 and host processor 198 receive modem transmit and receive modem timing signals 200, 206, and 208. Signal 210 is a constant 9.216 MHz clock for CMOS I/0 processor 176.

Host processor 198 controls the DFE through RUN signal line 204 which is latched by chip enable line 202. The host processor communicates with DFE 158 and ANAFEC 150 through CMOS processors 170 and 172 via host data bus 164 and serial data lines 184 and 186. Serial to-parallel conversion is implemented in CMOS signal processors 170, 172.

Figure 4:
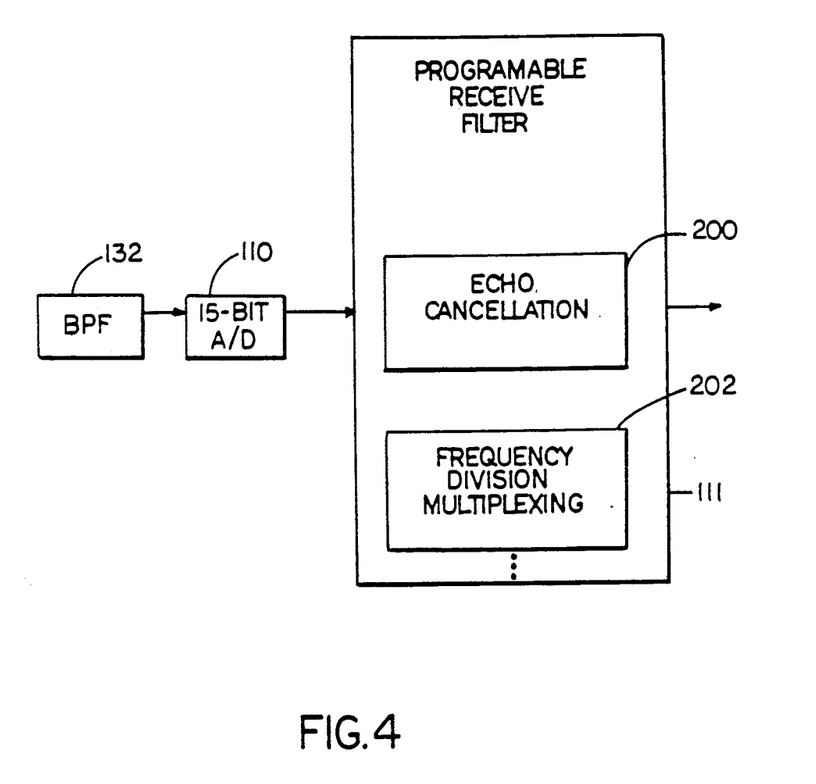
FIG. 4 is a block diagram of a portion of a multiple-mode modem.

Referring to FIG. 4, because the digital decimation filter of FIG. 1 enables A-to-D 110 to provide high resolution, it is possible for digital programmable receive filter 111 to be provided with programs for echo cancellation filtering 200, or frequency division multiplex filtering 202, or other modes, each of which is selectable by a mode selection signal 204. Then analog band pass filter 132 can be configured in a manner specifically suitable for the telephone line, but equally suitable for any mode of telephone line communication. Thus it is unnecessary to provide multiple analog filters 132.

Other embodiments of the filter may be derived for use with, e.g., third-order sigma-delta modulators.

I claim:

1. A digital decimation filter for receiving a stream of input digital samples at an input sample rate, and for delivering a corresponding stream of output digital samples at a different output sample rate, comprising
    a set of storage elements for storing a plurality of said input digital samples,
    circuitry for deriving samples of said output stream from said stored input digital samples, said circuitry including means for making an output sample available for inclusion in said output stream at all times, whereby said output sample may be provided with a selectable phase, said circuitry comprising a pair of integrate and dump circuits operated so that as one circuit is integrating, the sample most recently generated by the other integrate and dump circuit is available for inclusion in said output stream.

2. A digital decimation filter for receiving a stream of input digital samples at an input sample rate, and for delivering a corresponding stream of output digital samples at a different output sample rate, comprising set of storage elements for storing a plurality of said input digital samples, circuitry for deriving samples of said output stream from said stored input digital samples, said circuitry including means for making an output sample available for inclusion in said output stream at all times, whereby said output sample may be provided with a selectable phase, said circuitry comprising a non-decimating filter stage followed by a decimating integrate-and-dump stage.

3. A digital decimation filter for receiving a stream of input digital samples at an input sample rate, and for delivering a corresponding stream of output digital samples at a different output sample rate, comprising set of storage elements for storing a plurality of said input digital samples, circuitry for deriving samples of said output stream from said stored input digital samples, said circuitry including means for making an output sample available for inclusion in said output stream at all times, whereby said output sample may be provided with a selectable phase, said circuitry further comprising means for providing a selectable decimation ratio between said input sample rate and said output sample rate.

4. An analog-to-digital converter comprising
a sigma-delta modulator for generating a high rate stream of digital samples of an analog signal at a rate substantially higher than the Nyquist rate, and
a digital decimation filter for receiving said high rate stream and delivering a corresponding stream of filtered output digital samples at a lower rate, the decimation ratio of said higher rate to said lower rate being selectable.

5. The converter of claim 4 wherein said digital decimation filter includes circuitry for deriving samples of said output stream from said stored input digital samples, said circuitry including means for making an output sample available for inclusion in said output stream at times not limited to a single instant, whereby said output sample may be delivered with a selectable phase.

6. An analog-to-digital converter comprising a sigma-delta modulator for generating a high rate stream of digital samples of an analog signal at a rate substantially higher than the Nyquist rate, and
a digital decimation filter for receiving said high rate stream and delivering a corresponding stream of filtered output digital samples at a lower rate, the decimation ratio of said higher rate to said lower rate being selectable, said digital decimation filter comprising a FIR filter having successive storage elements for storing said high rate digital samples, and a mapping element for converting a set of signals tapped from fewer than all of said storage elements into a stream of values, said mapping element being configured to achieve a desired impulse response.

7. The converter of claim 6 wherein said mapping element performs no explicit multiplication.

8. The converter of claim 6 wherein the storage elements from which said set of signals are tapped is selected based on the desired said decimation ratio.

9. The converter of claim 8 comprising a multiplexer having inputs connected to a plurality of said storage elements, said multiplexer being controlled by a signal corresponding to said desired decimation ratio.

10. An analog-to-digital conversion method comprising
generating a high rate stream of digital samples of an analog signal at a rate substantially higher than the Nyquist rate, by sigma-delta modulation and
receiving said high rate stream and delivering a corresponding stream of filtered output digital samples at a lower rate, the decimation ratio of said higher rate to said lower rate being selectable.

11. A multiple-mode modem for use with a channel on which a carrier may be modulated in accordance with at least two different possible communication modes, said channel being of the kind that induces echo of the transmitted signal in the received signal path, two of said communication modes each comprising a different technique for avoiding the effects of said echo, the modem comprising receiving circuitry for receiving said modulated carrier from said channel and converting it to a corresponding stream of digital samples, said receive circuitry having an analog-to-digital converter feeding a programmable digital filter for selectively providing filtering functions applicable respectively to two different said echo avoidance techniques, whereby different receive filters applicable respectively to said different communication modes need not be provided ahead of said analog-to-digital converter, aid analog-to-digital converter comprising a sigma-delta modulator for generating a high rate stream of digital samples of an analog signal at a rate substantially higher than the Nyquist rate, and a digital decimation filter for receiving said high rate stream and delivering a corresponding stream of filtered output digital samples at a lower rate, the decimation ratio of said higher rate to said lower rate being selectable, said digital decimation filter comprising an FIR filter having successive storage elements for storing said high rate digital samples, and a mapping element for converting a set of signals tapped from fewer than all of said storage elements into a stream of values, said mapping element being configured to achieve a desired impulse response.

12. The modem of claim 11 wherein said mapping element performs no explicit multiplication.

13. The modem of claim 11 wherein the storage elements from which said set of signals are tapped is selected based on the desired said decimation ratio.

14. The modem of claim 13 further comprising a multiplexer having inputs connected to a plurality of said storage elements, said multiplexer being controlled by a signal corresponding to said desired decimation ratio.

15. A multiple-mode modem for use with a channel on which a carrier may be modulated in accordance with at least two different possible communication modes, said channel being of the kind that induces echo of the transmitted signal in the received signal path, two of said communication modes each comprising a different technique for avoiding the effects of said echo, the modem comprising receive circuitry for receiving said modulated carrier from said channel and converting it to a corresponding stream of digital samples, said receive circuitry having an analog-to-digital converter feeding a programmable digital filter for selectively providing filtering functions applicable respectively to two different said echo avoidance techniques, whereby different receive filters applicable respectively to said different communication modes need not be provided ahead of said analog-to-digital converter, said controllable digital filter including a set of storage elements for storing a plurality of input digital samples of said modulated carrier, and circuitry for deriving samples of said converter stream of digital samples from said stored input digital samples, said circuitry including means for making a derived sample available for inclusion in said converted stream at all times whereby said derived sample may be delivered with a selectable phase, said circuitry comprising a pair of integrate and dump circuits operated so that as one circuit is integrating, the sample most recently generated by the other integrate and dump circuit is available for inclusion in said stream.

16. A multiple-mode modem for use with a channel on which a carrier may be modulated in accordance with at least two different possible communication modes, said channel being of the kind that induces echo of the transmitted signal in the received signal path, two of said communication modes each comprising a different technique for avoiding the effects of said echo, the modem comprising receive circuitry for receiving said modulated carrier from said channel and converting it to a corresponding stream of digital samples, said receive circuitry having an analog-to-digital converter feeding a programmable digital filter for selectively providing filtering functions applicable respectively to two different said echo avoidance techniques, whereby different receive filter applicable respectively to said different communication modes need not be provided ahead of said analog-to-digital converter, said controllable digital filter including a set of storage elements for storing a plurality of input digital samples of said modulated carrier, and circuitry for deriving samples of said converted stream of digital samples from said stored input digital samples, said circuitry including means for making a derived sample available for inclusion in said converted stream at all times whereby said derived sample may be delivered with a selectable phase, said circuitry comprising a non-decimating filter stage followed by a decimating integrate-and-dump stage.

* * * * *

UNITED STATES PATENT AND TRADEMARK OFFICE
CERTIFICATE OF CORRECTION

PATENT NO.   : 5,051,981

DATED        : September 24, 1991

INVENTOR(S)  : Richard B. Kline

It is certified that error appears in the above-identified patent and that said Letters Patent is hereby corrected as shown below:

Title page:

Page 2, under OTHER PUBLICATIONS, in the "Yakawa" reference, "VSLI" should be --VLSI--.

Col. 1, line 15, "e.q." should be --e.g.--.

Col. 3, line 10, after "28", insert --(e.g.,--.

Col. 4, line 22, insert --i.e., d(i) and I(i) are inverse operations).--

Col. 4, line 64, "main" should be --gain--.

Col. 5, line 48, insert a hyphen between "180" and "192".

Col. 8, line 18, "receiving" (first occurrence) should be --receive--.

Col. 9, line 9, "converter" should be --converted--.

Signed and Sealed this

Second Day of February, 1993

Attest:

STEPHEN G. KUNIN

*Attesting Officer*   Acting Commissioner of Patents and Trademarks